(12) United States Patent
Mechlinski et al.

(10) Patent No.: US 10,928,450 B2
(45) Date of Patent: Feb. 23, 2021

(54) CIRCUIT PROTECTION SYSTEM AND METHOD

(71) Applicant: General Electric Company, Schenectady, NY (US)

(72) Inventors: Marius Michael Mechlinski, Garching (DE); Stefan Schroeder, Garching (DE); Jie Shen, Shanghai (CN); Fan Zhang, Shanghai (CN); Zhihui Yuan, Garching (DE)

(73) Assignee: General Electric Company, Schenectady, NY (US)

( * ) Notice: Subject to any disclaimer, the term of this patent is extended or adjusted under 35 U.S.C. 154(b) by 565 days.

(21) Appl. No.: 15/861,707

(22) Filed: Jan. 4, 2018

(65) Prior Publication Data

US 2018/0210031 A1 Jul. 26, 2018

(30) Foreign Application Priority Data

Jan. 25, 2017 (CN) .......................... 201710061050.4

(51) Int. Cl.
*G01R 31/327* (2006.01)
*H02H 5/04* (2006.01)
(Continued)

(52) U.S. Cl.
CPC .......... *G01R 31/3275* (2013.01); *H02H 3/08* (2013.01); *H02H 3/20* (2013.01); *H02H 5/04* (2013.01);
(Continued)

(58) Field of Classification Search
CPC .. H02M 1/088; H02M 1/32; H02M 2001/322; H03K 17/102;
(Continued)

(56) References Cited

U.S. PATENT DOCUMENTS 5,617,012 A   4/1997  Murakami
7,298,601 B2  11/2007 Covi et al.
(Continued)

FOREIGN PATENT DOCUMENTS

CN   102075097 A    5/2011
CN   104079153 A   10/2014
(Continued)

OTHER PUBLICATIONS

Machine translation of Zhang et al. Chinese Patent Document CN 104702125 A Jun. 10, 2015 (Year: 2015).*
(Continued)

*Primary Examiner* — Kevin J Comber
(74) *Attorney, Agent, or Firm* — Wood IP LLC

(57) ABSTRACT

A method for protecting a circuit is provided, wherein the circuit comprises a plurality of switch devices connected in series. The method comprises detecting a failure risk indicator of each switch device; determining whether each switch device has a failure risk based on the corresponding failure risk indicator; and making each of the switch device (s) having the failure risk in a constant on-state to eliminate the failure risk and prevent a failure of the switch device optionally if a number of the switch device(s) which have or had the failure risk is less than or equal to a preset value.

16 Claims, 4 Drawing Sheets

(51) Int. Cl.
*H02H 3/08* (2006.01)
*H02H 3/20* (2006.01)
*H02M 1/32* (2007.01)
*H02M 1/088* (2006.01)
*H03K 17/10* (2006.01)

(52) U.S. Cl.
CPC ............. *H02M 1/088* (2013.01); *H02M 1/32* (2013.01); *H03K 17/102* (2013.01); *H02M 2001/322* (2013.01); *H03K 2217/0027* (2013.01)

(58) Field of Classification Search
CPC .... H03K 2217/0027; H02H 3/20; H02H 3/08; H02H 5/04; G01R 31/3275
USPC .......................................................... 361/88
See application file for complete search history.

(56) References Cited

U.S. PATENT DOCUMENTS

| | | | |
|---|---|---|---|
| 8,963,371 | B2 | 2/2015 | Kinnard |
| 2013/0082762 | A1 | 4/2013 | Gan et al. |
| 2014/0368232 | A1 | 12/2014 | Wu |

FOREIGN PATENT DOCUMENTS

| | | | |
|---|---|---|---|
| CN | 104702114 A | | 6/2015 |
| CN | 104702125 A | * | 6/2015 |
| CN | 106655796 A | | 5/2017 |
| EP | 2 747 267 A1 | | 6/2014 |
| EP | 2 882 103 A1 | | 6/2015 |
| WO | 2011/064277 A2 | | 6/2011 |

OTHER PUBLICATIONS

Paananen, J., et al., "Increased power protection with parallel UPS configurations Making the selection between Distributed Bypass and Centralized Bypass systems", Eaton White Paper, pp. 1-10 (Mar. 2011).

Wu, R., et al., "Catastrophic Failure and Fault-Tolerant Design of IGBT Power Electronic Converters—An Overview", 39th Annual Conference of the IEEE Industrial Electronics Society, pp. 1-8 (2013).

Extended European Search Report and Opinion issued in connection with corresponding EP Application No. 18153241.7 dated May 16, 2018.

* cited by examiner

CIRCUIT PROTECTION SYSTEM AND METHOD

BACKGROUND

Embodiments of the present disclosure relate to circuit protection systems and methods.

Series-connected switch devices are widely used in power converters. Availability and reliability is one of the key issues for the application of series-connected switch devices in power converters. Many efforts have been devoted to prevent the circuit from breakdown due to a failure of the switch device.

In conventional methods, mechanical switches or semiconductor switches are used to bypass faulty switch devices, which has a time delay and could not prevent the failure of the faulty switch device.

Therefore, it is desirable to provide new circuit protection systems and methods to solve at least one of the above-mentioned problems.

BRIEF DESCRIPTION

In one aspect, a method for protecting a circuit is provided, wherein the circuit comprises a plurality of switch devices connected in series. The method comprises detecting a failure risk indicator of each switch device; determining whether each switch device has a failure risk based on the corresponding failure risk indicator; and making each of the switch device(s) having the failure risk in a constant on-state to eliminate the failure risk and prevent a failure of the switch device optionally if a number of the switch device(s) which have or had the failure risk is less than or equal to a preset value.

In another aspect, a system for protecting a circuit is provided, wherein the circuit comprises a plurality of switch devices connected in series. The system comprises a detecting device and a control device. The detecting device is configured to detect a failure risk indicator of each switch device. The control device is configured to determine whether each switch device has a failure risk based on the corresponding failure risk indicator, and make each of the switch device(s) having the failure risk in a constant on-state to eliminate the failure risk and prevent a failure of the switch device optionally if a number of the switch device(s) which have or had the failure risk is less than or equal to a preset value.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In an effort to provide a concise description of these embodiments, not all features of an actual implementation are described in one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of the present disclosure.

Unless defined otherwise, technical and scientific terms used herein have the same meaning as is commonly understood by one of ordinary skill in the art to which the present disclosure belongs. The terms "first," "second," "third," "fourth," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either any, several, or all of the listed items. The use of "including," "comprising," or "having," and variations thereof herein are meant to encompass the items listed thereafter and equivalents thereof as well as additional items.

Embodiments of the present disclosure refer to a system for protecting a circuit comprising a plurality of switch devices connected in series. The circuit can be widely used in power converters. With the system, a failure risk indicator of each switch device is detected and then used as a basis for determining whether the corresponding switch device has a failure risk. Subsequently, each of the switch devices determined to have the failure risk is made in an on-state to eliminate the failure risk. Thus, the system can prevent the failure of the switch devices, and keep the circuit and even the power converter in a good working condition.

Figure 1:
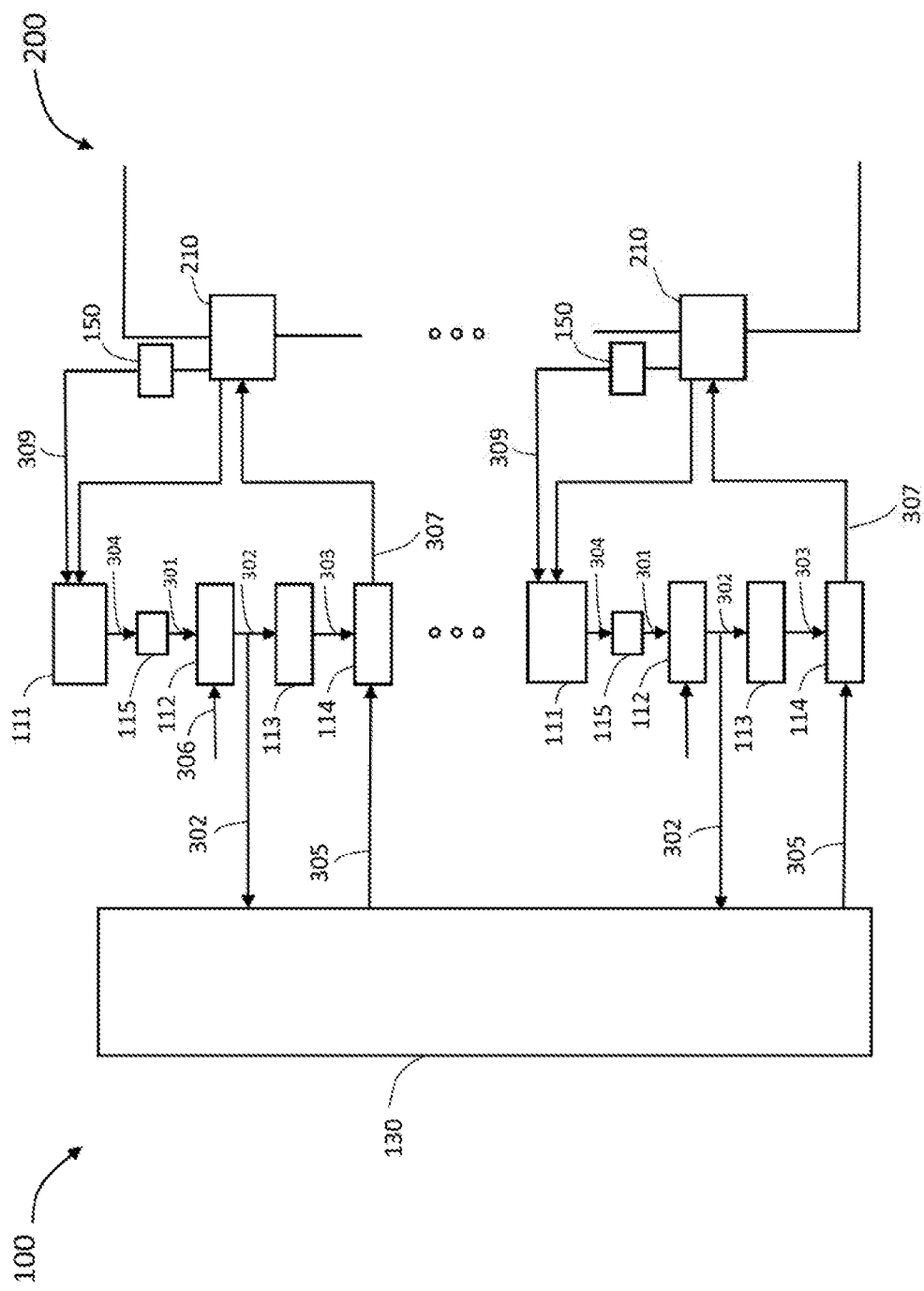
FIG. 1 is a sketch view of a circuit protection system in accordance with an exemplary embodiment of the present disclosure.

FIG. 1 is a sketch view of a system 100 for protecting a circuit 200. The circuit 200 comprises at least one series branch. The series branch comprises a plurality of switch devices 210 connected in series, wherein each switch device 210 comprises a metal-oxide-semiconductor field-effect transistor (MOSFET), an insulated gate bipolar transistor (IGBT), or another controllable semiconductor switch device. In some embodiments, the switch devices are packaged in modules or press-packs. A minimum number of the switch devices N in the series branch may be decided based on an operating voltage across the series branch and a maximum allowed operating voltage of each switch device 210. For example, the operating voltage across the series branch is about 8 kilovolts, and the maximum allowed operating voltage of each switch device is about 1 kilovolt. Thus, at least eight switch devices are required for the series branch to work normally, i.e., N=8. Due to the series connection of the switch devices, the circuit may be shut down to avoid a subsequent damage, if at least one switch device failed.

Usually, the series branch further comprises at least one additional switch device configured for redundancy besides the N switch devices, wherein a number of these switch devices for redundancy is defined as a redundancy number M (M≥1). Thus, an N+M redundancy operation mode can be achieved to increase an availability of the circuit. Under the N+M redundancy operation mode, if no more than M switch devices in the series branch are unavailable, the circuit can still work normally; or if more than M switch devices in the series branch are unavailable, the circuit should be shut down to avoid a subsequent damage. The "unavailable switch device" refers to the switch device having a failure risk at this moment, or the switch device had a failure risk before. In some embodiments, the switch device had the failure risk before is in a constant on-state. In some other embodiments, the "unavailable switch device" may further refer to the faulty switch device. In this case, the faulty switch device may be in a constant on-state.

In some embodiments, each switch device 210 comprises a plurality of sub-switch devices connected in parallel, which are turned on and off synchronously, in such a manner that a current carrying capacity of the switch device can be increased. In this case, the "unavailable switch device" refers to the switch device in which at least one sub-switch device is having a failure risk at this moment, or at least one sub-switch device had a failure risk before. In some embodiments, at least one sub-switch device of the switch device that had the failure risk before is in a constant on-state. In another embodiment, the "unavailable switch device" further refers to the switch device having at least one faulty sub-switch device and at least one healthy sub-switch device. In this case, at least one healthy sub-switch device of the switch device may be in a constant on-state.

The system 100 for protecting the circuit 200 comprises a detecting device for detecting failure risk indicators, a comparing device for comparing the failure risk indicators with reference conditions to obtain comparing result signals, and a control device for controlling the circuit based on the comparing result signals. The detecting device, the comparing device and the control device will be described in detail below.

The detecting device is configured to detect the failure risk indicator of each switch device 210. The failure risk indicator is used to predict a failure of the switch device, which may comprise a voltage across the switch device, a current through the switch device, a temperature of the switch device, an operating time of the switch device or a combination thereof. The failure risk indicator may also comprise a waveform of a signal obtained from the switch device which can indicate a working condition of the switch device.

In an embodiment, as shown in FIG. 1, the detecting device comprises a plurality of detectors 111 coupled with the plurality of switch devices 210, respectively, and each detector 111 is configured to detect the failure risk indicator 301 of the corresponding switch device 210. In other embodiments, at least a part of the detectors 111 may be integrated as a single detecting device.

The comparing device is configured to compare the detected failure risk indicator of each switch device with a reference condition to obtain a corresponding comparing result signal showing whether the failure risk indicator meets the reference condition. The reference condition used herein refers to a reference value range or a reference waveform of the failure risk indicator when the switch device works normally without failure risk. Determining whether the detected failure risk indicator meets the reference condition comprises determining if the failure risk indicator falls into the reference value range or conforms to the reference waveform.

In an embodiment, as shown in FIG. 1, the comparing device comprises a plurality of comparators 112 corresponding to the plurality of switch devices 210, respectively, each configured to compare the failure risk indicator 301 of the corresponding switch device 210 with the reference condition 306 to obtain the comparing result signal 302. In other embodiments, at least a part of the comparators 112 can be integrated as a single comparing device.

The control device is configured to determine whether each switch device has a failure risk based on the failure risk indicator. Specifically, the determining is based on the comparing result signal 302 from the comparator 112. The switch device is determined to have a failure risk if the comparing result signal 302 shows that the failure risk indicator does not meet the reference condition, and the switch device is determined to have no failure risk if the comparing result signal 302 shows that the failure risk indicator meets the reference condition. In some other embodiments, the switch device is determined to have a failure risk if the comparing result signal 302 shows that the failure risk indicator meets the reference condition, and the switch device is determined to have no failure risk if the comparing result signal 302 shows that the failure risk indicator does not meet the reference condition.

In some embodiments, the control device is configured to count a total number of the switch device(s) which have or had the failure risk, which is defined as a failure risk number. The switch device(s) which have or had the failure risk comprise the switch device(s) having the failure risk at this moment, and the switch device(s) had the failure risk before, the failure risk of which has been eliminated at this moment. In some embodiments, the switch device had the failure risk before has been made in a constant on-state. Then, the control device is configured to compare the failure risk number with a preset value to determine whether the failure risk number is greater than the preset value, wherein the preset value may be less than or equal to the redundancy number M.

The control device is configured to make each of the switch device(s) having the failure risk in a constant on-state to eliminate the failure risk and prevent the failure of the switch device. In some embodiments, the control device is configured to make each of the switch device(s) having the failure risk in a constant on-state if the failure risk number is less than or equal to the preset value. As such, the switch device in the constant on-state acts as a wire in the series branch without overvoltage. Since the overvoltage is a main cause leading to the failure of a switch device, making the switch device in the constant on-state can prevent the failure of the switch device. Meanwhile, the other switch devices in the series branch can keep working as normal. The control device may make the switch device in the constant on-state by sending a constant on-signal, for example, a high-level signal, to the switch device.

There may be a delay of the constant on-signal. To reduce or eliminate this delay, the control device may send a temporary on-signal to the switch device having the failure risk before sending the constant on-signal, in order to make the switch device in the on-state temporarily before the switch device receives the constant on-signal.

In some embodiments, if the failure risk number is greater than the preset value, or if the failure risk of the switch device remains after the switch device being made on, the control device is configured to shut down the circuit to prevent the circuit from damage.

In some embodiments, the control device is configured to make the switch device having the failure risk in the constant on-state before counting the failure risk number or while counting the failure risk number. In this case, the control device may turn on the switch device having failure risk at first and shut down the circuit later when the failure risk number is determined to be greater than the preset value.

The control device may comprise a single controller to implement the above-mentioned functions, or the control device may comprise a plurality of controllers to implement the above-mentioned functions.

In an embodiment, as shown in FIG. 1, the control device comprises a central controller 130, and a plurality of local controllers 113 and OR gates 114 corresponding to the plurality of switch devices 210 respectively. The OR gate 114 is coupled with the central controller 130 and the corresponding local controller 113 and configured to receive a central signal 305 from the central controller 130 and a local signal 303 from the local controller 113.

The central controller 130 is configured to receive the comparing result signals 302 and output a plurality of central signals 305 for controlling the switch devices respectively. Specifically, the central controller 130 determines whether each switch device has a failure risk according to its corresponding comparing result signal 302. Then, the central controller is configured to send a constant on-signal as the central signal 305 to each switch device having the failure risk to make it in the constant on-state.

Meanwhile, in some embodiments, the central controller 130 is configured to count the total number of the switch device(s) which have or had the failure risk, i.e., the failure risk number. If the failure risk number is greater than the preset value or if the failure risk of a switch device remains after the switch device being made on, the central controller 130 is configured to shut down the circuit 200. In some embodiments, the central controller 130 is configured to shut down the circuit by sending a constant off-signal, for example, a low-level signal, as the central signal 305 to the switch devices in the circuit.

In some embodiments, the central controller 130 is galvanically isolated from the circuit for safety concern, so there may be a propagation delay which will result in an action delay of the central controller. To solve this problem, the local controller 113 is configured to make the switch device having the failure in the on-state temporarily before the central controller sends the constant on-signal.

Each local controller 113 is configured to receive the corresponding comparing result signal 302, determine whether the corresponding switch device 210 has the failure risk, and generate the local signal 303. The local controller 113 generates a temporary on-signal, for example, a positive pulse, as the local signal 303 once the switch device is determined to have the failure risk, in order to make the switch device in the on-state temporarily before it receives the constant on-signal from the central controller 130. Otherwise, the local controller 113 keeps the local signal 303 in a low level. The OR gate 114 is configured to receive the corresponding central signal 305 and local signal 303, perform an OR operation on the central and local signal, and output a result of the OR operation as a control signal 307 for the corresponding switch device.

In a case that one switch device 210 is determined to have no failure risk, this switch device 210 may be turned on and off repetitively by the system 100 according to practical needs. For example, the central controller 130 sends a pulse width modulation (PWM) signal as the central signal 305 to the corresponding OR gate 114, and the local signal 303 keeps in the low level because of no failure risk, so the OR gate 114 will output a PWM signal as the control signal 307 to the switch device 210, in such a manner that this switch device will be turned on and off in accordance with the PWM signal.

In a case that one switch device is determined to have the failure risk, the central controller 130 sends a constant on-signal as the central signal 305 to the OR gate 114, and the local controller 113 sends a temporary on-signal as the local signal 303 to the OR gate 114. The local controller 113 is configured to send the temporary on-signal to the OR gate before the central controller sends the central signal 305. Thus, the OR gate 114 receives the temporary on-signal 303 earlier than the constant on-signal 305. The temporary on-signal 303 may be a positive pulse signal, which lasts at least until the OR gates receives the constant on-signal 305. As such, the switch device will be turned on by the temporary on-signal 303 at first and then be kept in the on-state by the constant on-signal 305.

In some embodiments, the local controller is coupled with the circuit directly, while the central controller is coupled with the circuit indirectly, in such a manner that the local controller will take an action earlier than the central controller once the failure risk occurs. For example, the local controller 113 is electrically connected with the circuit to control the circuit directly via electrical signals, in such a manner that the local controller takes the action in a respectively short time, for example, within a range from about 200 nanoseconds to 20 microseconds. The central controller is galvanically isolated from the circuit, so it takes longer time for the central controller to take the action, for example, within a range from about 300 nanoseconds to 30 microseconds.

In some embodiments, in a case that the failure risk number increases to the value greater than the preset value or if the failure risk of a switch device remains after the switch device being made on, the central controller is configured to shut down the circuit. For example, the central controller shuts down the circuit by sending constant off-signals as the central signals 305 to the switch devices never having a failure risk. In another example, the central controller shuts down the circuit by sending the constant off-signals to the switch devices never having the failure risk and the switch devices having a failure risk at this moment. In yet another example, the central controller sends the constant off-signals to all the switch devices in the circuit to shut down the circuit.

In an exemplary embodiment, the failure risk indicator comprises a voltage across the switch device ($V_A$). For example, if the switch device is a MOSFET, the voltage refers to a voltage between a drain and a source of the MOSFET; if the switch device is an IGBT, the voltage refers to a voltage between a collector and an emitter of the IGBT. Accordingly, the reference condition is preset as: $V_A$ is lower than a threshold voltage $V_{TH}$ ($V_A<V_{TH}$), wherein the threshold voltage $V_{TH}$ is equal to or higher than an operating voltage ($V_{OP}$) of the switch device. Therefore, the switch device will be determined to have a failure risk when the $V_A$ increases to a value equal to or higher than $V_{TH}$. The operating voltage ($V_{OP}$) mentioned herein refers to a voltage across the switch device during an off state of the switch device when the switch device is working normally.

Figure 2:
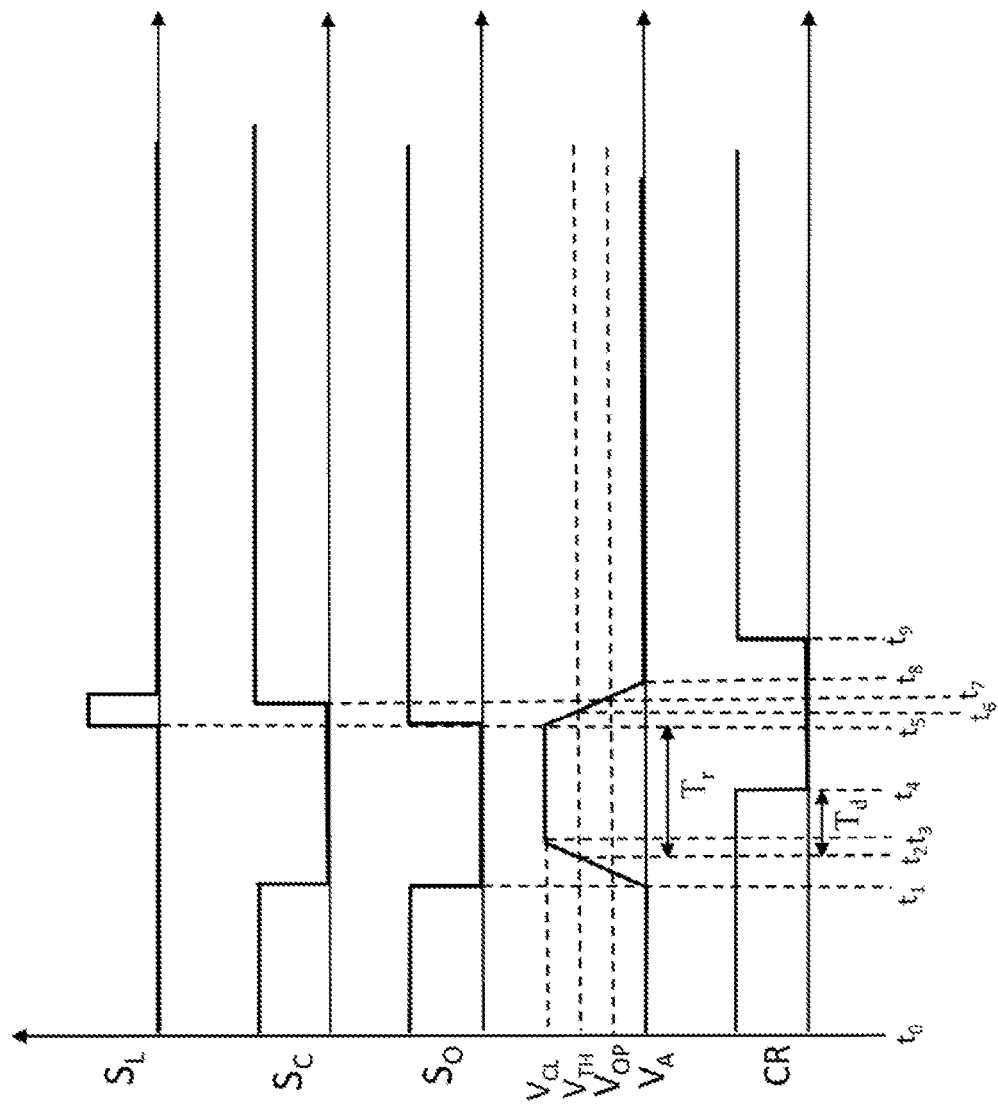
FIG. 2 shows a sequential relationship among a voltage ($V_A$) across a switch device and a comparing result signal (CR) indicating a failure risk of the switch device, and a central signal ($S_C$), a local signal ($S_L$) and a control signal ($S_O$) for controlling the switch device, in a case that the switch device has a failure risk.

FIG. 2 shows a sequential relationship among the central signal ($S_C$), the local signal ($S_L$), the control signal ($S_O$), the voltage across the switch device ($V_A$) and the comparing result signal (CR), in a case that the switch device has a failure risk.

Referring to FIG. 2, during time period $t_0$-$t_1$, the switch device works normally. The central controller sends a high-level signal as the central signal $S_C$ to the OR gate and the OR gate outputs a high-level signal as the control signal $S_O$ to keep the switch device on during time period $t_0$-$t_1$, so $V_A$ stays around zero, and CR also stays at a high level since $V_A$ is lower than $V_{TH}$.

$S_C$ is switched to a low level signal at moment $t_1$, and $S_O$ also turns to low level accordingly in order to turn off the switch device. During time period $t_1$-$t_3$, $V_A$ increases rapidly in response to the falling edge of $S_O$. $V_A$ increases to a value equal to $V_{TH}$ at moment $t_2$. Subsequently, CR goes to a low level at moment $t_4$, since $V_A$ no longer meets the reference condition. Time period $t_2$-$t_4$ is defined as a detection delay $T_d$. In some embodiment, the detection delay $T_d$ is in the range from about 100 nanoseconds to 10 microseconds.

local controller 113 receives the low level CR and generates a positive pulse as the local signal $S_L$ at moment $t_5$, to make $S_O$ turn to the high level accordingly and further turn the switch device on. The positive pulse lasts till $S_C$ turns to the high level at moment $t_7$, in such a manner that $S_O$ has been in the high level since moment $t_5$ which indicates the switch device has been in the on-state since moment $t_5$. Time period $t_2$-$t_5$ is defined as a total response time $T_r$. $T_r$ is short enough to avoid a destruction of the switch device having the failure risk. In some embodiments, $T_r$ is in the range from about 200 nanoseconds to 20 microseconds, which shows a fast response to the failure risk.

As a result, $V_A$ rapidly decreases to zero from moment $t_5$ to $t_8$, during which $V_A$ decreases to $V_{TH}$ at moment $t_6$. After moment $t_6$, $V_A$ meets the reference condition again, and thus CR goes back to the high level at moment $t_9$.

In some embodiments, the system further comprises a plurality of clamping elements corresponding to the switch devices 210, respectively, each configured to clamp the voltage across the switch device around a clamping voltage ($V_{CL}$). The control device is also configured to determine that the switch device has the failure risk if the voltage is clamped. $V_{CL}$ is higher than or equal to $V_{TH}$. As shown in FIG. 2, $V_A$ increases to $V_{CL}$ at moment $t_3$, and then $V_A$ is clamped around $V_{CL}$ during time period $t_3$-$t_5$, in such a manner that a damage of the switch device can be prevented. $V_{TH}$ may be in a range from about 1.0 kilovolt to 2.5 kilovolt, and $V_{CL}$ may be in a range from about 1.3 kilovolt to 2.5 kilovolt. For example, $V_{TH}$ is about 1.5 kilovolt, and $V_{CL}$ is about 1.6 kilovolt.

In an embodiment, as shown in FIG. 1, the clamping element 150 is an active clamping element in addition to the corresponding switch device 210, which achieves an active clamping function. $V_{CL}$ is lower than or equal to a nominal voltage $V_N$ of the switch device, and $V_{TH}$ is set between $V_{CL}$ and $V_{OP}$, i.e., $V_N \geq V_{CL} \geq V_{TH} \geq V_{OP}$. In this case, the clamping element 150 will send a clamping signal 309 to the detector 111 while clamping the voltage. Therefore, the detector 111 is able to detect the voltage clamping of the corresponding switch device. The occurrence of the voltage clamping is deemed as one failure risk indicator in this case. The nominal voltage mentioned herein refers to a maximum allowed voltage which does not result in an immediate destruction of the switch device. In some embodiments, $V_N$ is about 1.7 kilovolt.

In some embodiments, the clamping element may be included in the switch device, which means that the switch device has a self-clamping function. In this case, $V_{CL}$ is higher than or equal to the nominal voltage $V_N$ of the switch device, and $V_{TH}$ is set between $V_N$ and $V_{OP}$, i.e., $V_{CL} \geq V_N \geq V_{TH} \geq V_{OP}$. The clamping of the voltage may be detected by measuring the value of $V_A$. Once the value of $V_A$ exceeds $V_{TH}$ and subsequently stays around $V_{CL}$, the control device determines that the corresponding switch device has the failure risk.

In some embodiments, the system 100 further comprises a false-triggering preventing device 115 configured to confirm the failure risk of the switch device before the control device makes the switch device in an on-state or shuts down the circuit, in order to prevent a false triggering. The false-triggering preventing device 115 may comprise a filter configured to filter a signal of the failure risk indicator to remove a spike or a pulse of the signal, in such a manner that the false triggering will be avoided. In an embodiment, as shown in FIG. 1, the filter 115 is coupled between the detector 111 and the comparator 112 and configured to receive the original failure risk indicator signal 304 and output a processed failure risk indicator signal 301.

In some embodiments, the local controller is configured to send a constant on-signal to the corresponding switch device if the switch device is determined to have a failure risk. Meanwhile, in some embodiments a feedback signal is sent to the central controller which indicates that the corresponding switch device has or had a failure risk, or that the switch device has been made in the constant on-state. Optionally, the central controller is configured to count the total number of the switch device(s) which have or had the failure risk, i.e., the failure risk number. Once the failure risk number increases to a value greater than the preset value or if the failure risk of a switch device remains after the switch device being made on, the central controller may shut down the circuit. The central controller may shut down the circuit by sending constant off-signals as central signals to the switch devices without the failure risk.

Figure 3:
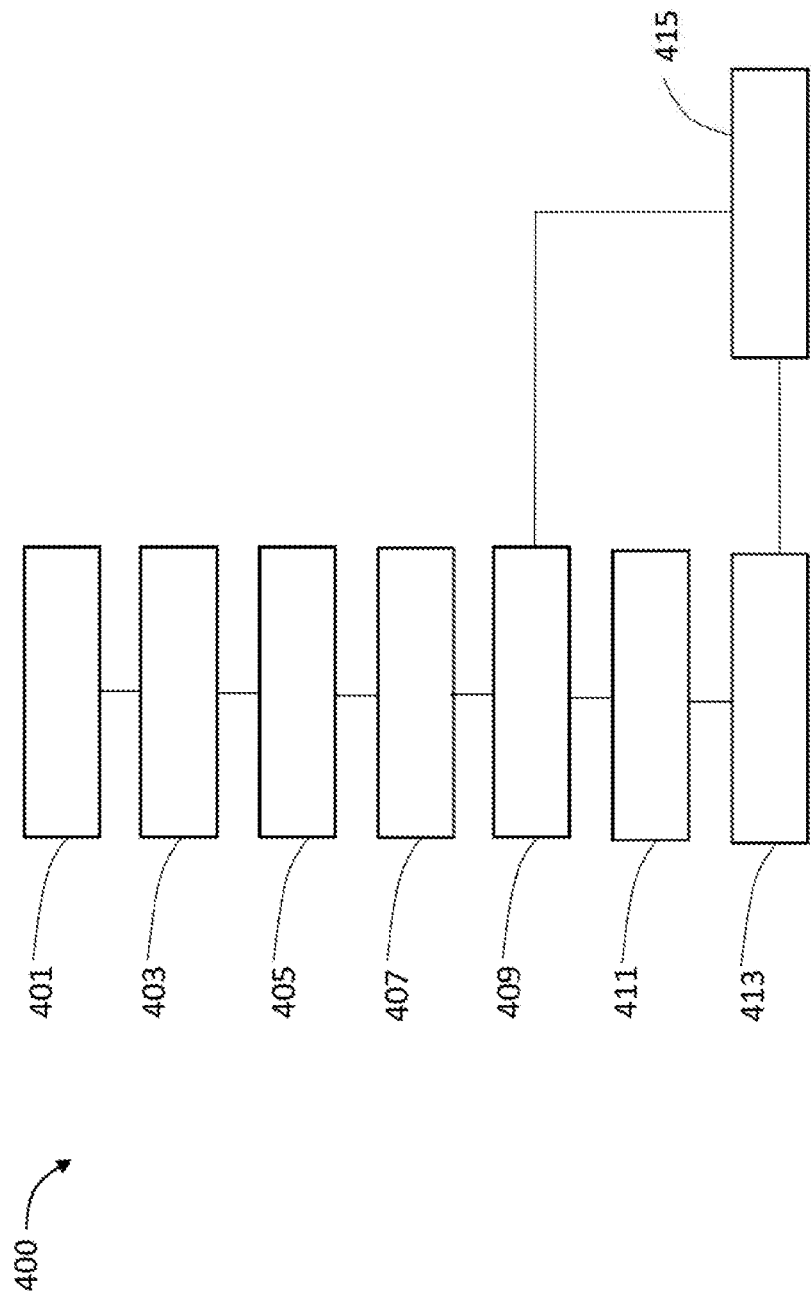
FIG. 3 is a flowchart illustrating a circuit protection method in accordance with an exemplary embodiment of the present disclosure.

Embodiments of the present disclosure also refer to a method 400 for protecting a circuit comprising a plurality of switch devices connected in series. As shown in FIG. 3, the method 400 comprises step 401 to step 415. While the actions of the method 400 are illustrated as functional blocks, the order of the blocks and the separation of the actions among the various blocks shown in FIG. 3 are not intended to be limiting. For example, the blocks may be performed in a different order and an action associated with one block may be combined with one or more other blocks or may be sub-divided into a number of blocks.

In step 401, a failure risk indicator of each switch device is detected, wherein the failure risk indicator is configured to predict a failure of the corresponding switch device, and the failure risk indicator may comprise a voltage across the switch device, a current through the switch device, a temperature of the switch device, an operation time of the switch device or a combination thereof.

In step 403, the failure risk indicator of each switch device is compared with a corresponding reference condition to obtain a comparing result signal showing whether each failure risk indicator meets the corresponding reference condition. In some embodiments, the reference condition is set based on a failure risk model of the switch device, wherein the failure risk model is established based on cloud data.

Step 405 relates to determining whether each switch device has a failure risk according to the comparing result signal. The switch device is determined to have no failure risk if the comparing result signals shows that the failure risk indicator meets the corresponding reference condition, or the switch device is determined to have the failure risk if the comparing result signals shows that failure risk indicator doesn't meet its corresponding reference condition.

In a specific embodiment, step 401 comprises detecting the voltage across the switch device. Step 403 comprises comparing the voltage with a threshold voltage to obtain a comparing result signal showing whether the voltage is equal to or higher than the threshold voltage, wherein the threshold voltage is equal to or higher than an operating voltage of the switch device. Step 405 comprises determining whether the switch device has a failure risk according to the comparing result signal. The switch device is determined to have a failure risk when the voltage increases to a value equal to or higher than the threshold voltage. In some embodiments, the method further comprises clamping the voltage across the switch device around a clamping voltage, which is higher than or equal to the threshold voltage. In this case, step 405 further comprises determining that the switch device has the failure risk if the voltage is clamped.

In a case that no switch device is determined to have a failure risk, steps 401-405 are executed again. In other words, steps 401-405 will be repeated until at least one switch device is determined to have the failure risk.

In a case that at least one switch device is determined to have the failure risk, step 407 will be optionally executed, which comprises confirming the failure risk of the switch device to prevent a false triggering of following steps. In a case that the failure risk of the corresponding switch device is confirmed, the following steps are executed. In another case that the failure risk of the corresponding switch device is not confirmed, steps 401-407 will be repeated until the failure risk is confirmed.

Optionally, step 409 relates to counting a failure risk number, i.e., a total number of the switch device(s) which have or had a failure risk, and comparing the failure risk number with a preset value, for example, a redundancy number. In some embodiments, the step of counting the failure risk number is not executed. In this case, once at least one switch device is determined to have the failure risk, the switch device(s) having the failure risk will be made in constant on-state.

If at least one switch device is determined to be having the failure risk and the failure risk number is less than or equal to the preset value, step 411 will be executed, which comprises sending a constant on-signal to each of the switch device(s) having the failure risk to make the switch device in a constant on-state, in such a manner that the failure risk will be eliminated and thus the failure of the switch device can be prevented. As mentioned in the descriptions about the circuit protection system, the constant on-signal may be sent by the central controller or the local controller or a combination thereof. If the failure risk number is larger than the preset value, step 415 will be executed, which comprises shutting down the circuit.

Step 413 relates to determining whether the failure risk of the switch device is eliminated after the switch device is made in the on-state.

If the failure risk of the switch device is determined to be eliminated, steps 401-413 will be executed again, or steps 401-409 and step 415 will be executed.

Optionally, if the failure risk of the switch device remains after the switch device being made on, step 415 will be executed, which comprises shutting down the circuit.

Figure 4:
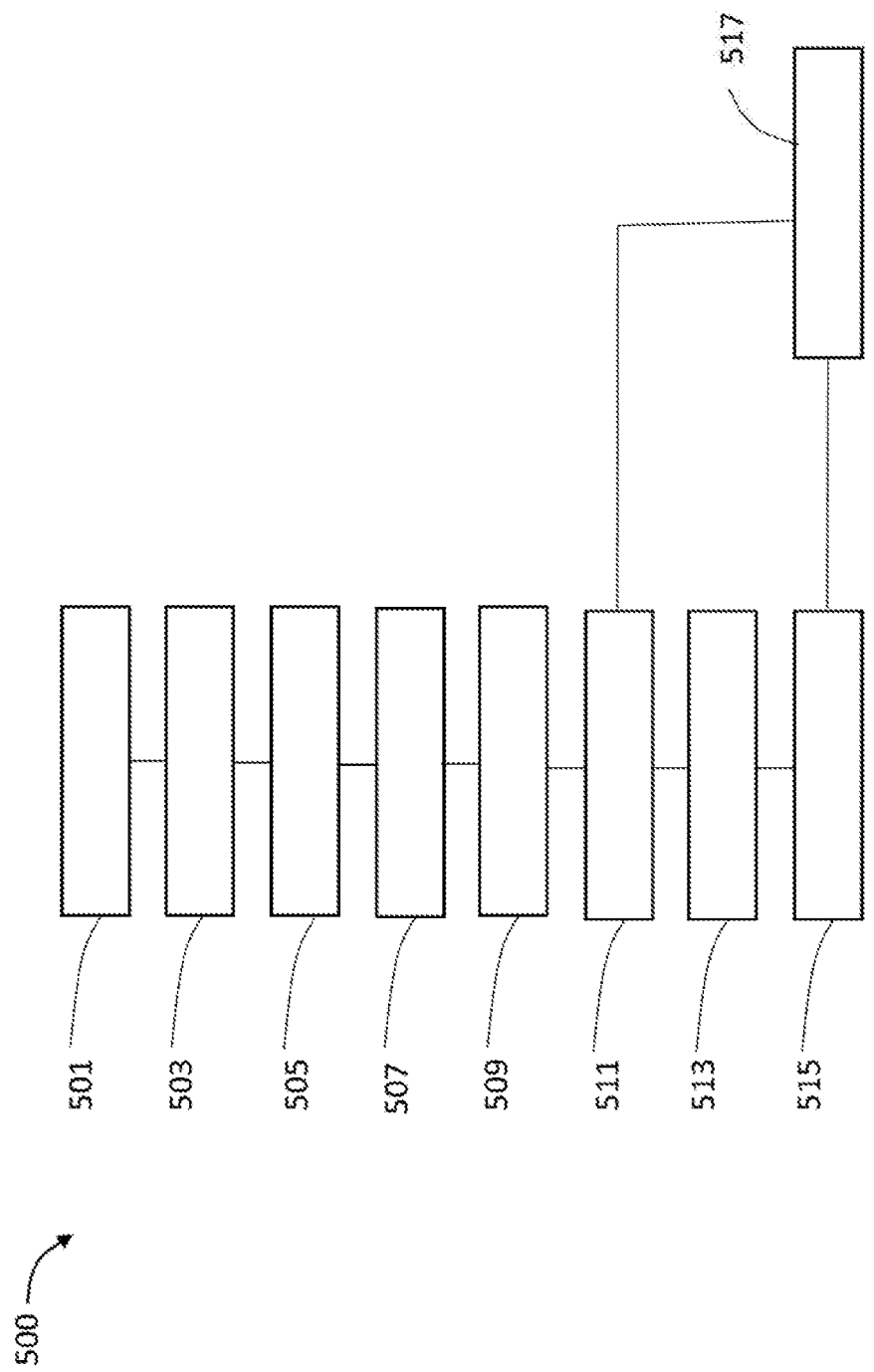
FIG. 4 is a flowchart illustrating a circuit protection method in accordance with another exemplary embodiment of the present disclosure.

FIG. 4 shows a flowchart illustrating a circuit protection method 500 in accordance with another exemplary embodiment of the present disclosure. Referring to FIG. 4, the method 500 comprises steps 501-517.

Steps 501-507 are similar with steps 401-407 of the method 400 illustrated in FIG. 3, which will not be repeated here.

If at least one switch device is confirmed to have the failure risk, step 509 will be executed, which comprises sending a temporary on-signal to each of the switch device(s) having the failure risk to make the switch device in an on-state for a short time.

Meanwhile or subsequently, a failure risk number is counted and compared with a preset value, as shown in step 511, which is similar with step 409 in FIG. 3. In some embodiments, step 511 can be optionally executed. In a case that step 511 is not executed, if at least one switch device is confirmed to have the failure risk, step 513 is executed.

If the failure risk number is less than or equal to the preset value, step 513 is executed, which relates to sending a constant on-signal to each of the switch device(s) having the failure risk, in order to continue to make the switch device in the on-state after the temporary on-signal ends.

Step 515 relates to determining whether the failure risk of the switch device is eliminated after the switch device is made in the on-state.

If the failure risk of the switch device is determined to be eliminated, steps 501-515 will be executed again, or steps 501-511 and step 517 will be executed.

Optionally, if the failure risk number is greater than the preset value or if the failure risk of the switch device remains after the switch device being made on, step 517 will be executed, which comprises shutting down the circuit.

As will be understood by those familiar with the art, the present disclosure may be embodied in other specific forms without deviating from the spirit or essential characteristics thereof. Accordingly, the disclosures and descriptions herein are intended to be illustrative, but not limiting, of the scope of the disclosure which is set forth in the following claims.

The invention claimed is:

1. A method for protecting a circuit comprising a plurality of switch devices connected in series, the method comprising:

detecting, via a detecting device, a failure risk indicator of each switch device of the plurality of switch devices;

comparing, via a comparing device the detected failure risk indicator with a reference condition to obtain a corresponding comparing signal;

determining, via a central control device, whether each switch device has a failure risk based on the corresponding signal comparing signal;

making, via the central control device, each switch device of the plurality of switch devices having the failure risk in a constant on-state by generating a constant on-signal to eliminate the failure risk if a number of switch devices of the plurality of switch devices which have or had the failure risk is less than or equal to a preset value; and before receiving the constant on-signal from the central control device, generating a temporary on-signal to each switch device of the plurality of switch devices having the failure risk, the temporary on-signal being generated by a plurality of local control devices corresponding to the plurality of switch devices.

2. The method according to claim 1, wherein the constant on-signal is a high-level signal.

3. The method according to claim 2, wherein the temporary on-signal is a local signal.

4. The method according to claim 1, further comprising shutting down the circuit if the number of the switch devices which have or had the failure risk is greater than the preset value, or if the failure risk of the switch device remains after the switch device being made on.

5. The method according to claim 1, further comprising confirming the failure risk of the switch device before making the switch device in the constant on-state.

6. The method according to claim 1, wherein the failure risk indicator comprises a voltage across the switch device, and the determining comprises determining that the switch device has the failure risk if the voltage increases to a value equal to or higher than a threshold voltage, and the threshold voltage is equal to or higher than an operating voltage of the switch device.

7. The method according to claim 1, further comprising clamping a voltage across the switch device around a clamping voltage, wherein the failure risk indicator comprises a clamping signal showing an occurrence of the clamping of the voltage, and the determining comprises determining that the switch device has the failure risk if the clamping signal is detected.

8. The method according to claim 1, wherein the failure risk indicator comprises a current through the switch device, a temperature of the switch device, an operation time of the switch device, or a combination thereof.

9. A system for protecting a circuit comprising a plurality of switch devices connected in series, the system comprising:
   a detecting device configured to detect a failure risk indicator of each switch device of the plurality of switch devices;
   a comparing device configured to compare the detected failure risk indicator with a reference condition to obtain a corresponding comparing signal;
   a central control device configured to (i) determine whether each switch device has a failure risk based on the corresponding signal comparing signal, and (ii) make each switch device of the plurality of switch devices having the failure risk in a constant on-state by generating a constant on-signal to eliminate the failure risk if a number of the switch device of the plurality of switch devices which have or had the failure risk is less than or equal to a preset value; and
   a plurality of local control devices corresponding to the plurality of switch devices respectively, the plurality of local control devices being configured to (i) receive the comparing signal (ii) determine whether a switch device of the plurality of switch devices has the failure risk and (iii) generate a local signal;
   wherein when a failure risk is determined in one or more switch devices of the plurality of switch devices, the corresponding local control device generates a temporary on-signal as the local signal in order to temporarily make the one or more switch devices having the failure risk in the on-state before receiving the constant on-signal from the central control device.

10. The system according to claim 9, wherein the constant on-signal is a high level signal.

11. The system according to claim 10, wherein the control device is configured to send a temporary on-signal to the switch device having the failure risk before sending the constant on-signal.

12. The system according to claim 9, wherein the control device is configured to shut down the circuit if the number of the switch devices which have or had the failure risk is greater than the preset value or the failure risk of the switch device remains after the switch device being made on.

13. The system according to claim 9, further comprising a false-triggering preventing device configured to confirm the failure risk of the switch device before the control device makes the switch device in the constant on-state.

14. The system according to claim 9, wherein the failure risk indicator comprises a voltage across the switch device, and the control device is configured to determine that the switch device has the failure risk, if the voltage increases to a value equal to or higher than a threshold voltage, wherein the threshold voltage is equal to or higher than an operating voltage of the switch device.

15. The system according to claim 9, further comprising a clamping element configured to clamp a voltage across the switch device around a clamping voltage, wherein the failure risk indicator comprises a clamping signal showing an occurrence of the clamping of the voltage, and the control device is configured to determine that the switch device has the failure risk if the detecting device detects the clamping signal.

16. The system according to claim 9, wherein the failure risk indicator comprises a current through the switch device, a temperature of the switch device, an operation time of the switch device, or a combination thereof.

* * * * *